United States Patent [19]

Hsue et al.

[11] Patent Number: 5,488,009

[45] Date of Patent: Jan. 30, 1996

[54] POST-TITANIUM NITRIDE MASK ROM PROGRAMMING METHOD

[75] Inventors: Chen-Chiu Hsue, Hsin chu; Yi-Chung Shen, Taichung; Shing-Ren Sheu, Tao-Yuan; Chen-Hui Chung, Hsin-Chu, all of Taiwan

[73] Assignee: United Microelectronics Corporation, Hsinchu, Taiwan

[21] Appl. No.: 344,004

[22] Filed: Nov. 23, 1994

[51] Int. Cl.⁶ ................................................. H01L 21/8246
[52] U.S. Cl. ........................ 437/52; 437/45; 437/48; 437/192
[58] Field of Search ......................... 437/45, 48, 52, 437/192, 200

[56] References Cited

U.S. PATENT DOCUMENTS 4,356,042  10/1982  Gedaly et al. .................... 437/5
5,275,959  1/1994  Kobayashi et al. ............... 437/52
5,378,649  1/1995  Huang ............................... 437/52

Primary Examiner—Tom Thomas
Attorney, Agent, or Firm—George O. Saile; Jerry Jones

[57] ABSTRACT

A method of manufacturing a code pattern on a semiconductor substrate with an array of substantially parallel buried bit lines integral therewith and with word lines above the buried bit lines, includes: forming a titanium nitride layer above the word lines, forming and patterning a code mask above the titanium nitride layer, implanting impurities into the substrate through openings in the code mask to form the code pattern, and performing rapid thermal annealing of the implant. The step height of the titanium nitride layer is employed to form the code identification on the substrate.

20 Claims, 11 Drawing Sheets

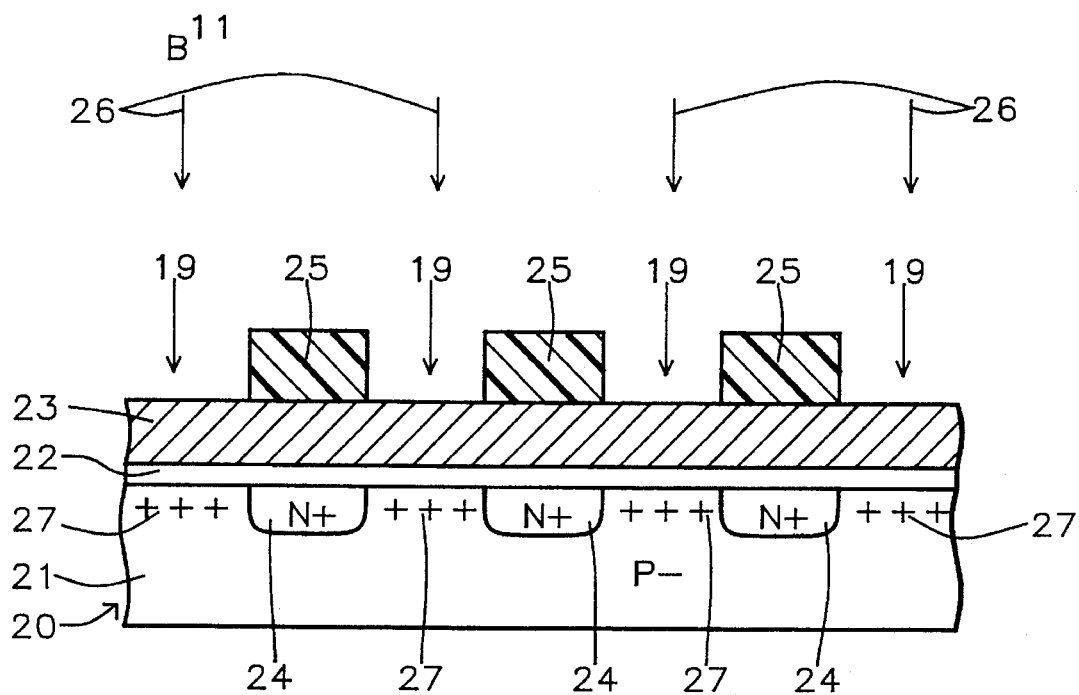
*FIG. 1A - Prior Art*
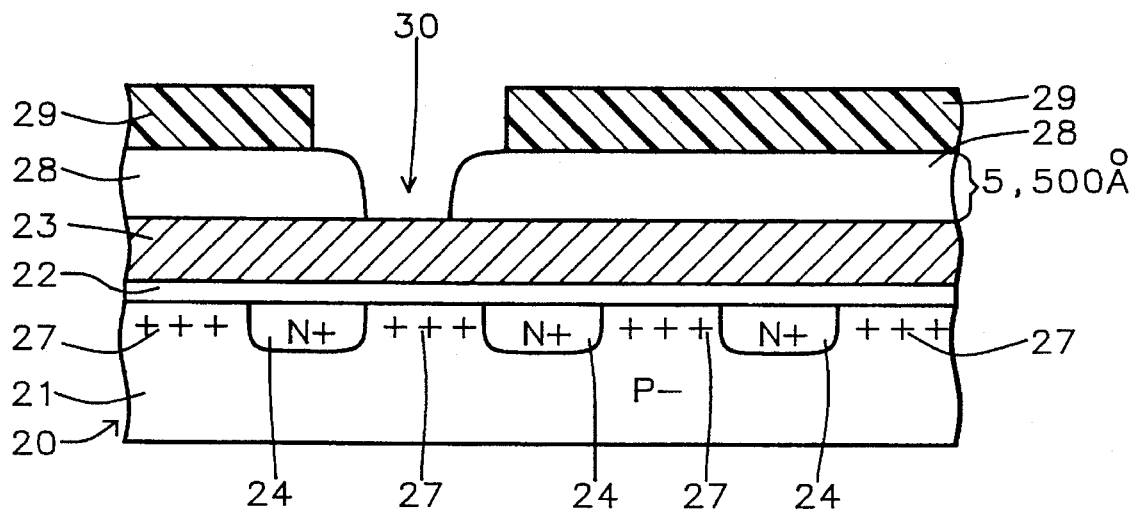
*FIG. 1B - Prior Art*

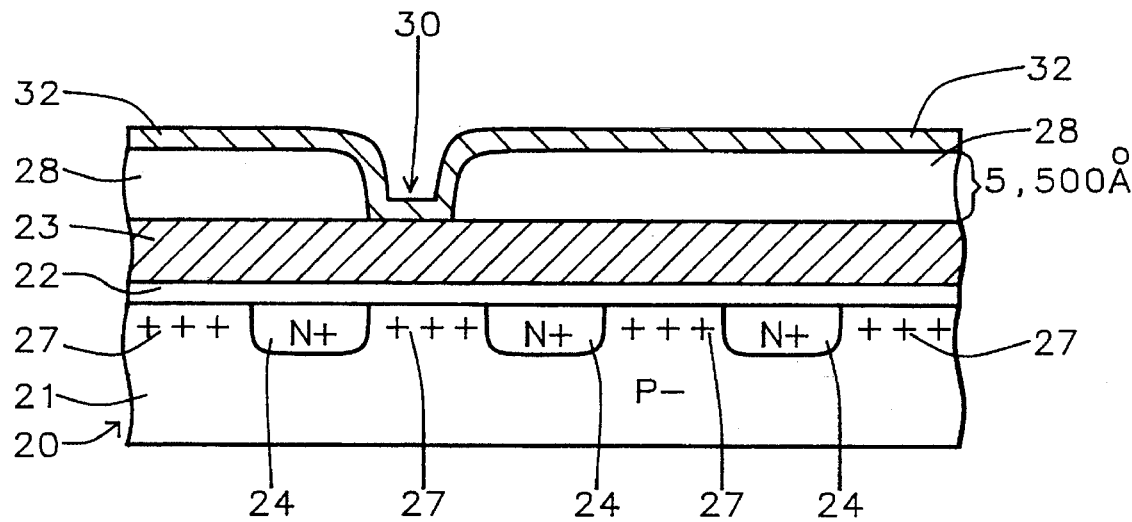
FIG. 1C – Prior Art
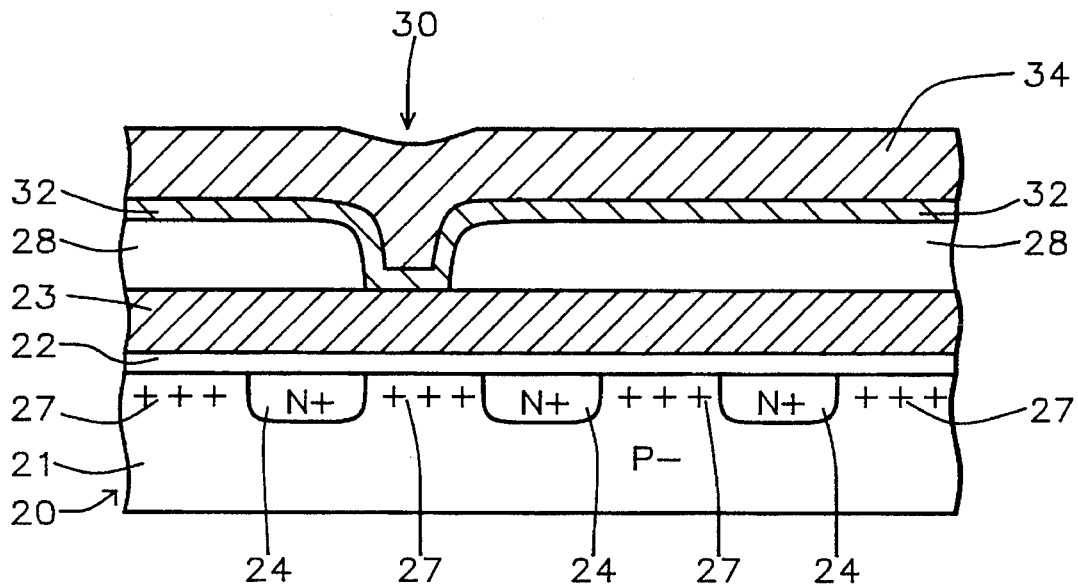
FIG. 1D – Prior Art

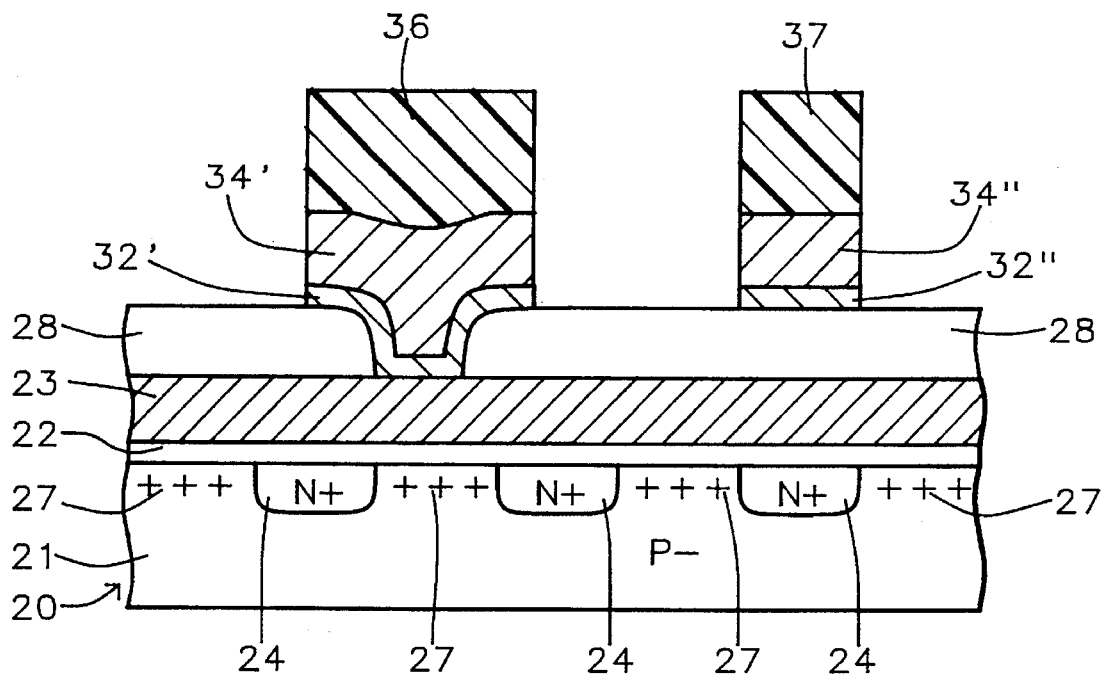
FIG. 1E – Prior Art
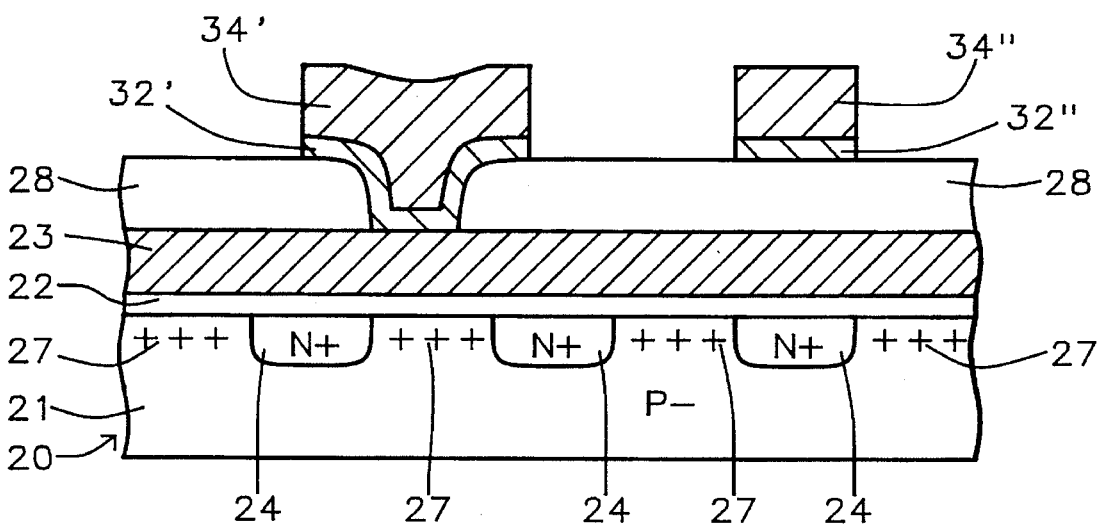
FIG. 1F – Prior Art

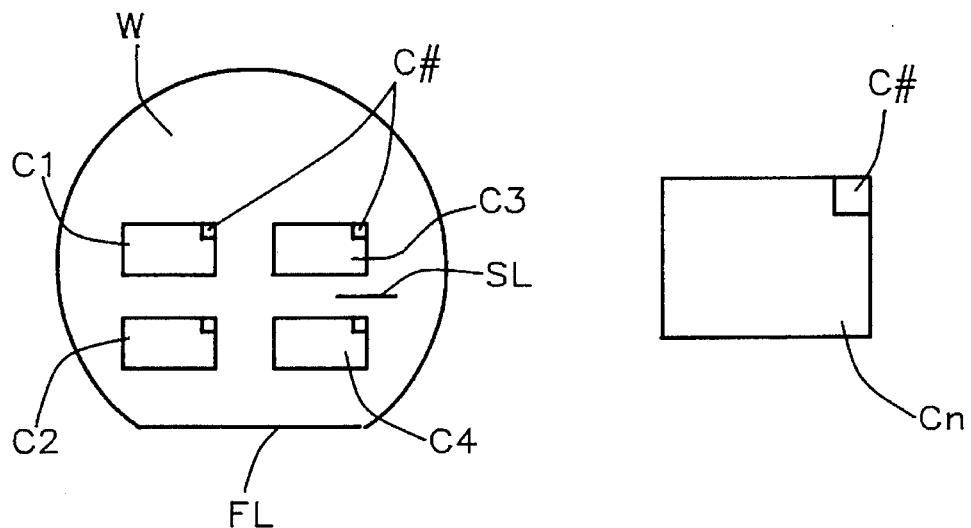
FIG. 6A
Prior Art
FIG. 6B
Prior Art
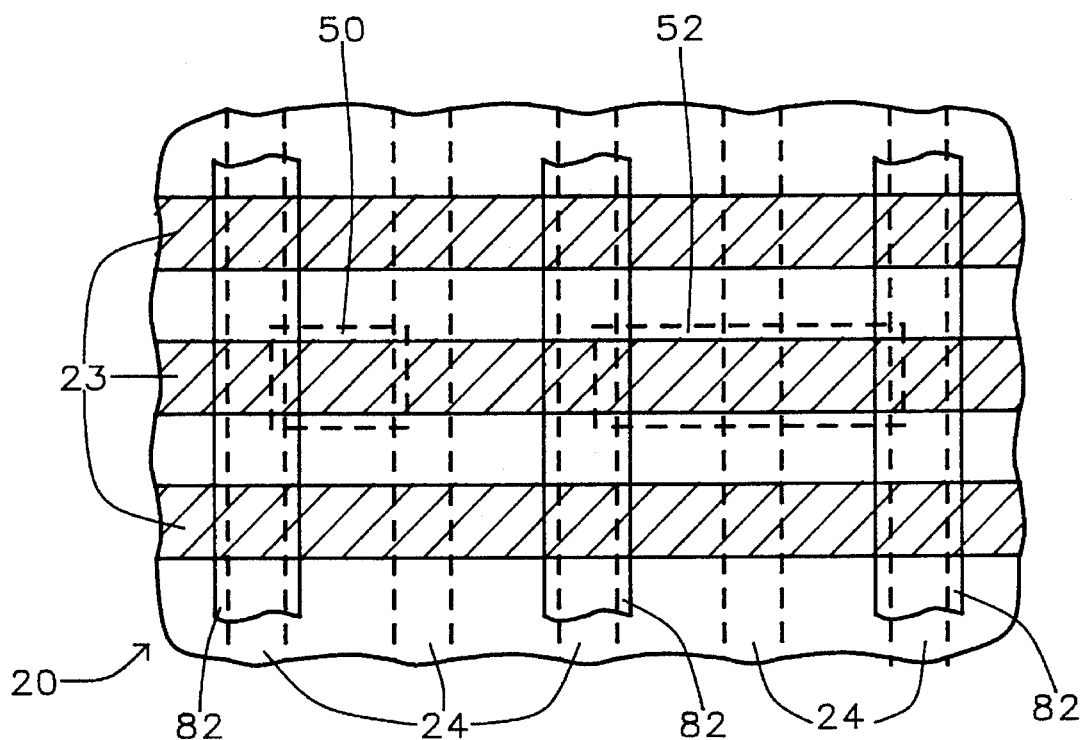
FIG. 3

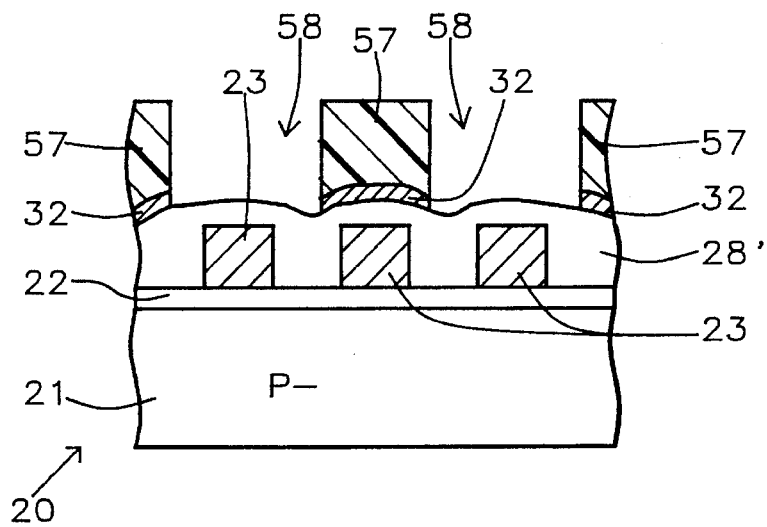
FIG. 4C
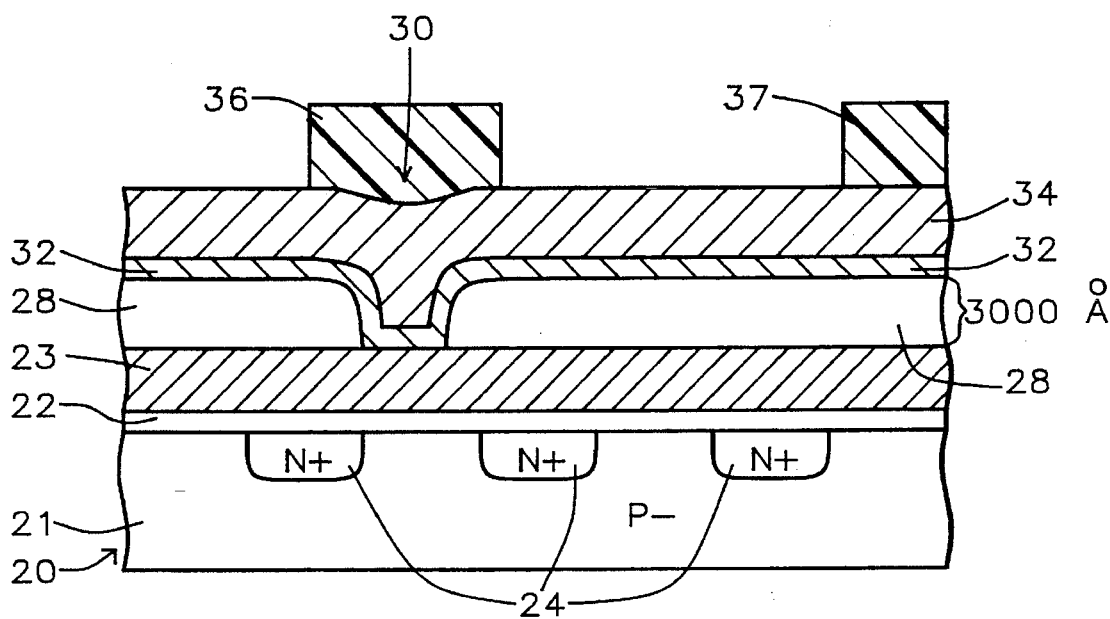
FIG. 5A – Prior Art

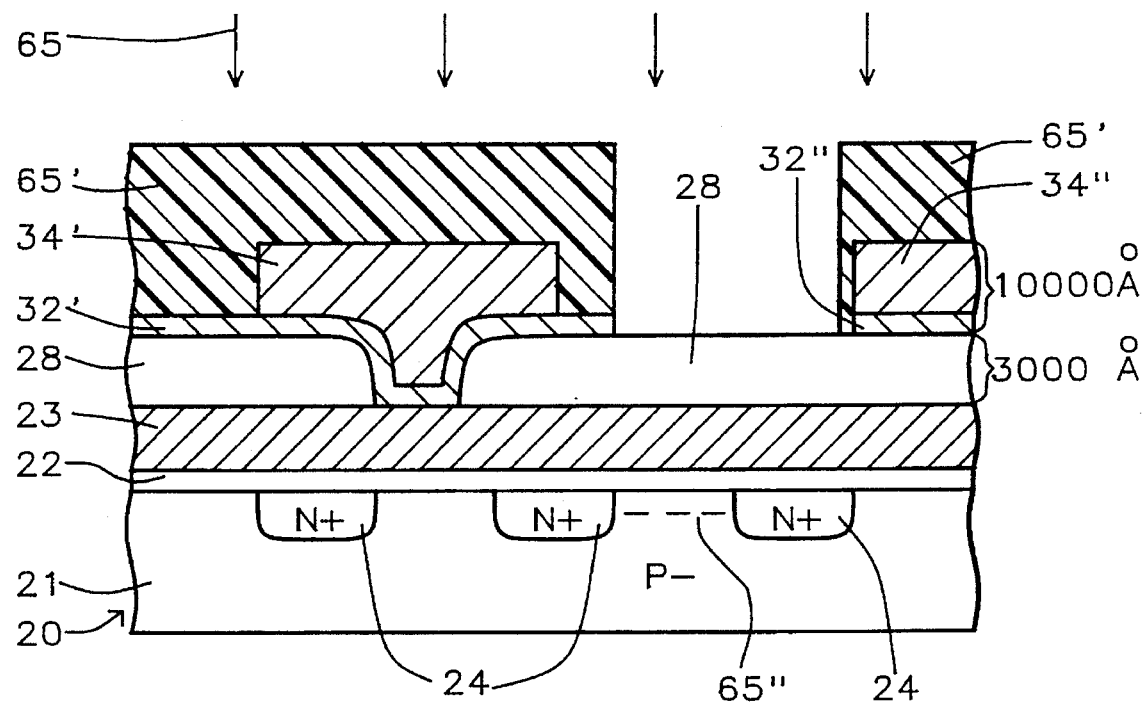
FIG. 5B – Prior Art
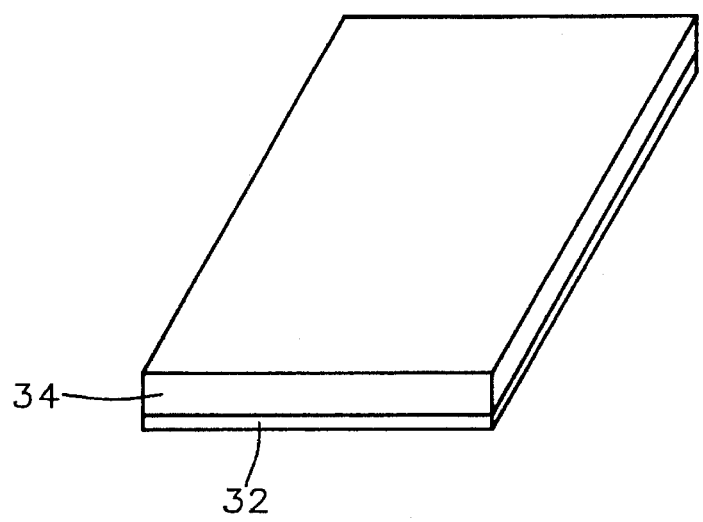
FIG. 5C – Prior Art

POST-TITANIUM NITRIDE MASK ROM PROGRAMMING METHOD

BACKGROUND OF THE INVENTION

1. Field of the Invention

This invention relates to semiconductor memory devices and more particularly to methods of manufacture of mask ROM memory devices and the devices produced thereby.

2. Description of Related Art

The manufacturing process turn around time for manufacture of conventional Mask ROM devices comprises on the order of several weeks. Poor yield prediction is always a problem that exists between the customer and the fabrication operators. On the other hand, the post-metal mask process can provide a short turn around time of a few days. However, the minimum dimension is limited by the ROM photolithographic resolution induced by the metal step height. The cell leakage is also a problem for the post metal ROM.

FIGS. 1A–1F show the process flow for producing a prior art conventional mask ROM device 20.

FIG. 1A shows a first phase of the process performed in manufacturing the device 20 which includes a P— doped silicon substrate 21 with buried N+ bit lines 24. Over the substrate is formed a conventional blanket gate oxide layer 22 upon which is formed a polysilicon word line 23. Over the polysilicon word line 23 is a ROM code implant photoresist mask 25 with an array of openings 19 into which code implant boron $B^{11}$ ions 26 are implanted in regions 27 between the buried N+ bit lines 24. After the code has been implanted, the prior art adds the code number process including a first step of forming a photoresist coating; second, exposing the number window; third, code etching; fourth, removing all photoresist.

As shown in FIG. 1B, above the polysilicon word line 23 is formed a blanket dielectric layer 28 of BPSG glass (BPSG (BoroPhosphoSilicate Glass)) which is a dielectric material that can be used as insulation between semiconductor device structures having a thickness of about 5,500Å in which a contact hole opening 30 down to word line 23 has been formed by etching through a photoresist mask layer 29.

Then the photoresist mask layer 29 is removed.

Next, as shown in FIG. 1C, a blanket layer of titanium (Ti) 32 is sputtered onto device 20 covering the BPSG layer 28 and the exposed surface of word line 23. Next, the titanium is converted to titanium nitride (TIN) by the process of RTA (rapid thermal annealing.) The process is, first, heat to 600° C. for 60 seconds and second heat to 780° C. for 20–30 seconds with a source of $NH_3+N_2$ extending down into contact with polysilicon layer 23 through opening 30 in dielectric layer 28.

Next, as shown in FIG. 1D, the device 20 is coated with a blanket layer of metal 34 (aluminum) with a thickness of 10kÅ formed at a temperature of 400° C. by sputtering for 12 seconds, which extends into opening 30 in electrical contact with the polysilicon layer 23 through the titanium nitride (TIN) layer 32.

Referring to FIG. 1E, the blanket layer of metal 34 on device 20 has been patterned with photolithographic metallization mask with patterns 36 and 37 that were formed above layers 34 and 32 in FIG. 1D. Then an etching process is performed in which mask patterns 36 and 37 are used to protect metal structures 34', 34" and 32', 32" which are formed by etching of metal layer 34 and TiN layer 32.

FIG. 1F shows the prior art device of FIG. 1E after the masks 36 and 37 have been removed.

After this stage of the process, the device is passivated in accordance with the state of the art.

FIGS. 5A–5C shows the process flow for producing another prior art conventional mask ROM device 20. FIG. 5A shows the first step performed upon a P— doped silicon substrate 21 with buried N+ bit lines 24. Upon the substrate is a conventional blanket gate oxide layer 22 upon which is formed a blanket polysilicon layer 23 or word line 23.

As shown in FIG. 5B above the polysilicon layer 23 is formed a blanket dielectric layer 28 of BPSG glass having a thickness of about 3,000Å in which a contact hole opening 30 has been formed into which a blanket layer of titanium (Ti) 32 is sputtered. Next, the titanium is converted to titanium nitride (TIN) by the process of RTA (rapid thermal annealing.) The process is, first, heat to 600° C. for 60 seconds and second heat to 780° C. for 20–30 seconds with a source of $NH_3+N_2$ extending down into contact with polysilicon layer through opening 30 in dielectric layer 28.

Next, the device 20 was coated with a blanket layer of metal 34 (aluminum) with a thickness of 10kÅ formed at a temperature of 400° C. by sputtering for 12 seconds, which extends into opening 30 in electrical contact with the polysilicon layer 23 through the titanium nitride (TIN) layer 32. The blanket layer of metal 34 on device 20 was patterned with metallization photolithographic mask with patterns 36 and 37. Mask patterns 36 and 37 are used to protect metal structures 34' and 34" and TiN structures 32' and 32" which are formed by etching of metal layer 34 and TiN layer 32.

Then a ROM code implant photoresist mask 65' is formed over structure 34' with a code ion implant of boron $B^{11}$ ions 65 implanted in region 65" between a pair of buried N+ bit lines 24. After the code has been implanted and the prior art adds the code number process including code etching (in post-metal process, one can directly etch without another photoresist step because there is the BPSG layer as the buffer for the cell opening.)

FIG. 5C shows a perspective view of a TiN layer 32 above which is formed an aluminum layer 34.

In accordance with this invention, a method is provided for manufacturing a ROM semiconductor device on a semiconductor substrate. The method is performed on a substrate which includes an array of parallel buried bit lines integral buried therein oriented in a first direction. A gate oxide layer covers the substrate and word lines are formed above the gate oxide layer. A dielectric layer is formed over the word lines. A contact hole is formed in the dielectric layer. Then a blanket titanium nitride layer is formed over the device so that it extends into the contact hole. Then, over the device, form a ROM code mask having a ROM code opening therethrough, the opening being centered between a pair of the bit lines. Etch the titanium nitride layer through the ROM code opening, with the titanium nitride layer having a step height. Ion implant a code implant dopant through the ROM code opening down into a doped region in the substrate below the ROM code opening. Then remove the ROM code mask, followed by performing a rapid thermal annealing step. Then apply a blanket layer of metallization to the device including the contact hole, and pattern the metallization.

Preferably, the dielectric layer comprises a boron phosphorous glass material; and the dielectric has a thickness of within the range between about 2,000Å and about 4,000Å.

Preferably, the dielectric has a thickness of about 3,000Å; and the step height is within the range between about 400Å and about 700Å. More preferably, the step height is about 500Å.

Preferably, the rapid thermal annealing is performed within a range between about 650° C. and about 850° C.; and more preferably, the rapid thermal annealing is performed at about 750° C.

In accordance with another aspect of the invention, a method is provided for manufacturing a ROM semiconductor device on a semiconductor substrate. At the outset of the method, the substrate includes an array of parallel buried bit lines integral therewith, the buried bit lines being oriented in a first direction, and a gate oxide layer above the substrate and word lines formed above the gate oxide layer.

The first step of the process comprises forming a dielectric layer over the word lines, followed by forming a contact hole in the dielectric layer. Then form a blanket titanium nitride layer over the device extending into the contact hole. Next, form a ROM code mask over the device, the ROM code mask having a ROM code opening and a code number opening therethrough, the ROM code opening being centered between a pair of the bit lines. Next, perform a TiN etching through the ROM code mask, followed by ion implanting a code implant dopant through the ROM code opening down into a doped region in the substrate below the ROM code opening. Then, remove the ROM code mask and the code number mask, and following that perform a rapid thermal annealing step. Next, apply a blanket layer of metal to the device including the contact hole, and pattern the metal.

Preferably, the dielectric layer comprises a material selected from BPSG and BPTEOS, and the dielectric has a thickness of within the range between about 2,000Å and about 4,000Å and preferably about 3,000Å.

Preferably, the step height is within the range between about 400Å and about 700Å and preferably about 500Å and the rapid thermal annealing is performed within a range between about 650° C. and about 850° C., and preferably at about 750° C.

Features and advantages of this invention are as follows:

(1) This invention provides a method of manufacturing a Mask ROM achieving a short turn around time of a few days as contrasted with the several week turn around time of conventional Mask ROM processes for a Chip on Board (COB) ROM product.

(2) Manufacture of ROM products of the COB form requires the removal of a thin titanium nitride (TiN) film under a PAD window before metal sputtering to avoid a bonding problem between the metal and the TiN film. This invention provides a combined ROM mask and a PAD mask to remove the TiN layer on the cell circuit and in the PAD region, both at the same time. Both FIGS. 3 and 4A show cell structures. The PAD region is located on the periphery of the circuit for wire bonding.

COB products use the aluminum wire bonding technology unlike the gold wire bonding technology using on conventional IC products. Aluminum wire bonding has higher stress between the aluminum and the TiN interface, so TiN must be removed for good adhesion.

(3) When the TiN has been removed there are three advantages. First, the implant energy required is reduced. Second, the PAD region is removed in TiN for the COB device. Third, the oxide loss by TiN overetching can provide the code etching so another mask and etching cycle is not required. The ROM process can be implemented easily unlike the prior art post-metal process.

In the prior art, there was a photolithographic limitation induced by the metal step height of typically 8kÅ–10kÅ, whereas in accordance with this invention the step height has been reduced to about 500Å.

For example, in FIG. 5B, the post metal step height of layers 34' and 34" is about 8kÅ–10kÅ. In connection with this invention, the step height of layer 32" is about 500Å.

(4) The additional RTA (Rapid Thermal Anneal Process) step following the ROM implantation in accordance with this invention is another advantage. This new RTA process fully activates the code implant region and reduces the high buried N+ (BN+) bit line sheet resistance resulting from code implant damage which results in lower resistance.

(5) The advantage of full code activation is that it can provide a high code threshold voltage; and low implanted BN+ sheet resistance can reduce the current drop in the cell and reduce timing delay. The combination of both items achieves high circuit performance at high voltages.

(6) The post-metal mask ROM process employs a low temperature furnace alloy (below 500° C.) for code activation and implanted BN+ sheet resistance compensation. This low temperature process cannot make the circuit provide optimum performance, but a high temperature RTA step (750° C.) in accordance with this invention does provide optimum performance.

(7) Full activation in accordance with this invention can reduce the leakage current of a cell in comparison with post-metal ROM.

BRIEF DESCRIPTION OF THE DRAWINGS

The foregoing and other aspects and advantages of this invention are explained and described below with reference to the accompanying drawings, in which:

FIGS. 1A–1F show the process flow for producing a prior art conventional mask ROM device.

FIGS. 2A–2H are cross sectional views taken along the length of a word line and across the parallel array of buried bit lines of the device.

FIG. 3 shows a plan view of a device in accordance with this invention including buried bit lines (in phantom) in the substrate, and polysilicon word lines (in phantom) orthogonally oriented with respect to bit lines and overlying the bit lines.

FIG. 4C is a sectional view taken along line 4C—4C in FIG. 4A.

FIGS. 5A–5C shows the process flow for producing another prior art conventional mask ROM device.

FIGS. 6A and 6B show a schematic diagram of a prior art technique of location of chip numbers on semiconductor chips on a semiconductor wafer used in accordance with this invention.

DESCRIPTION OF THE PREFERRED EMBODIMENT

Figure 2A:
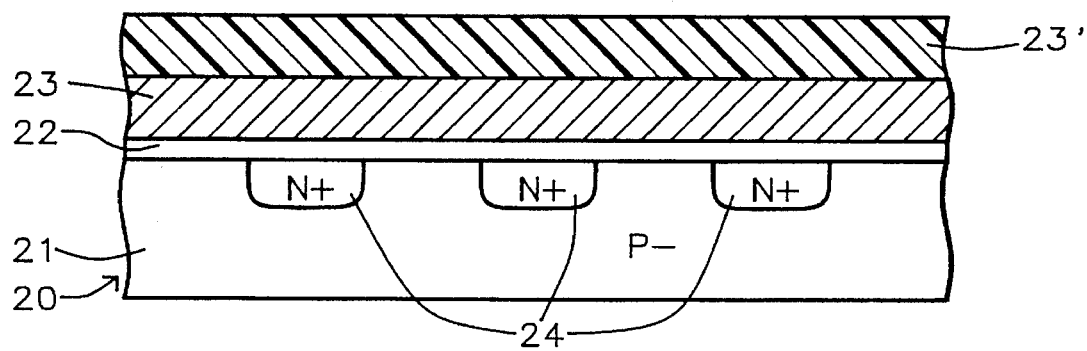
FIGS. 2A–2H show the process flow in accordance with a first implementation of this invention for producing a mask device.

FIGS. 2A–2H show the process flow in accordance with a first implementation of this invention for producing a mask ROM device 20. FIGS. 2A–2H are cross sectional views taken along the length of a word line 23 and across the parallel array of buried bit lines 24. FIG. 2A shows the first step, performed upon a P— doped silicon substrate 21 with buried N+ bit lines 24. Formed on substrate 21 is a conventional blanket gate oxide layer 22 upon which is formed a blanket polysilicon layer which is etched through openings in mask 23' to form a conventional, parallel array of word lines 23 extending transversely from left to right across the device 21.

Figure 2B:
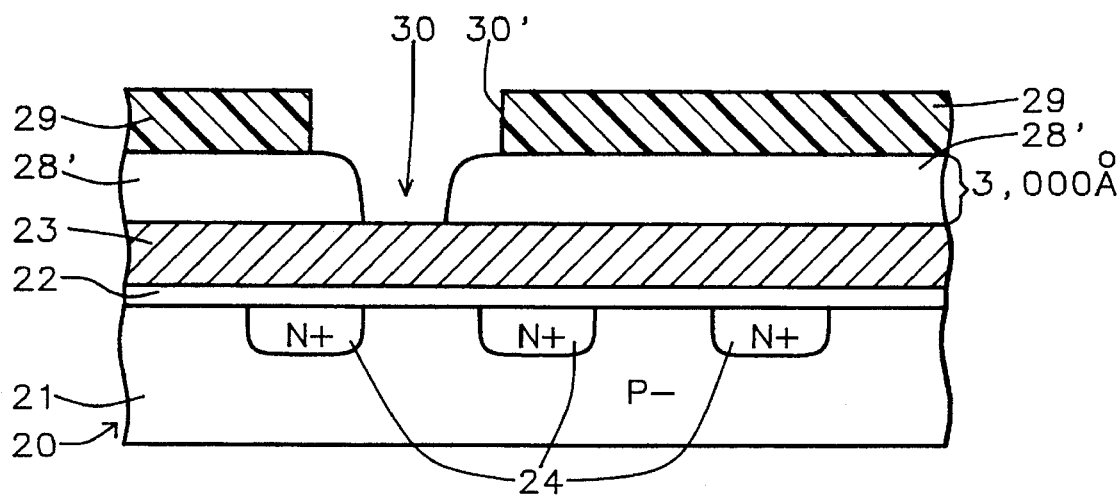

FIG. 2B shows the product of FIG. 2A, after the mask 23' has been stripped from the device. Then over the polysilicon layer 23 has been formed a blanket dielectric layer 28' of BPSG glass. BPSG glass layer 28' has a thickness of about 3,000Å.

Next, a photoresist mask layer 29 was formed over device 20 with an opening 30' therein. By etching through opening 30' in photoresist mask layer 29, a contact hole opening 30 has been formed in BPSG layer 28' exposing the surface of polysilicon word line 23.

Then the photoresist mask layer 29 is removed.

Figure 2C:
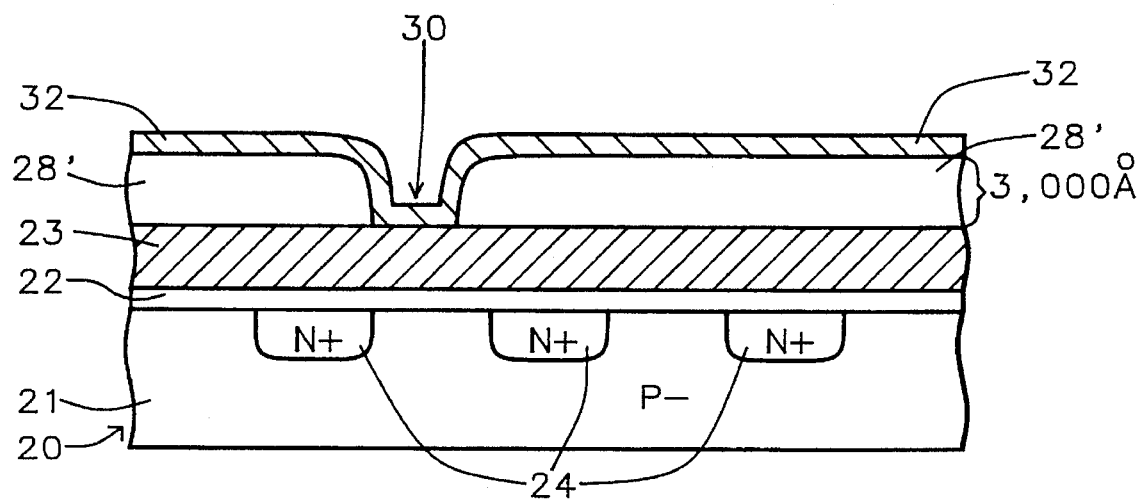

Next, in FIG. 2C the product of FIG. 2B is shown after sputtering an interim blanket titanium (Ti) layer over BPSG layer 28' and down into opening 30 into electrical and mechanical contact with word line 23. Next, the interim titanium layer is converted to titanium nitride (TIN) layer 32 by the process of RTA (rapid thermal annealing. The process is, first, heat to 600° C. for 60 seconds. Second, heat to 780° C. for 20–30 seconds with a source of $NH_3+N_2$ extending down into contact with polysilicon layer through opening 30 in dielectric layer 28'. The TiN layer 32 having a thickness preferably of 500Å is within the range between about 400Å and about 700Å. This thickness provides a low step height in accordance with this invention.

Figure 2D:
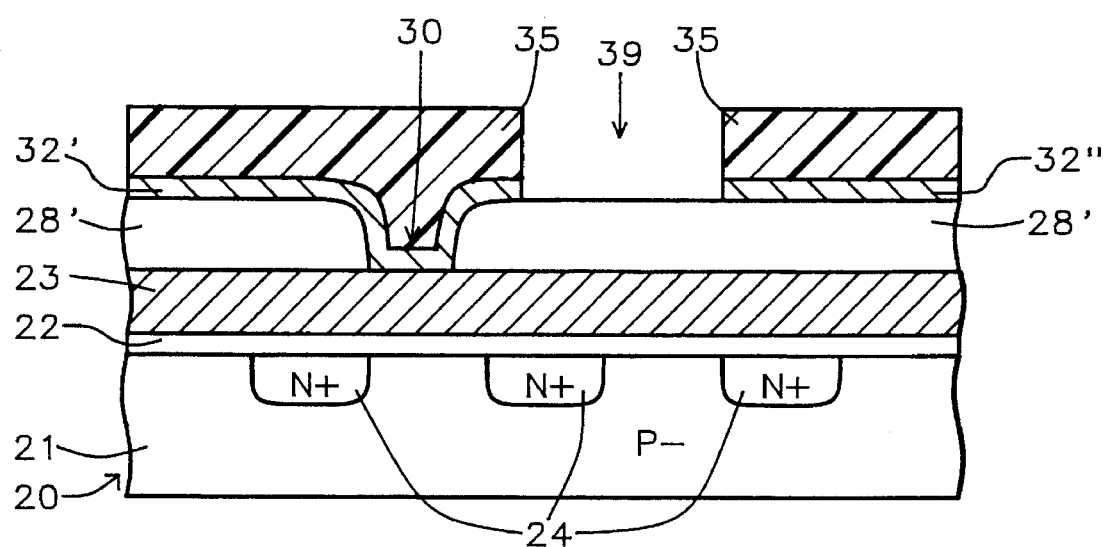

Next, the device 20 of FIG. 2C is shown in FIG. 2D, with the titanium nitride layer 32 after it has been etched through openings 39 in a mask 35 and thereby patterned into patterns 32' and 32". A TiN ROM layer photoresist mask 35 for patterning an array of openings 39 in the code region and PAD region is formed. Portions of TiN layer 32, which are not protected by ROM mask 35, are removed by etching.

Figure 2E:
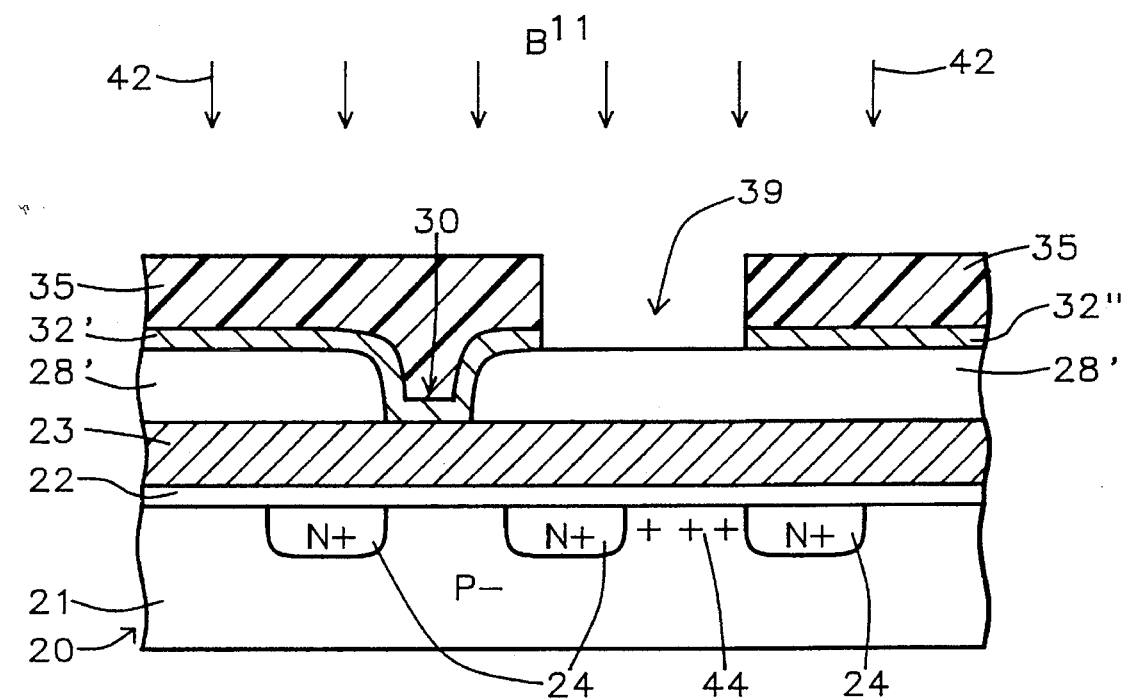

As shown in FIG. 2E, the device 20 is covered with a ROM code implant photoresist mask 35 with a ROM code implant opening 39. Since code implantation can be done when etching of TiN layer 32 is completed, there is no need to use another photoresist mask to show the code number. When the TiN layer 32 has been removed to form openings 39, the code implant boron $B^{11}$ ions 42 are implanted through openings 39 into region 44 between a pair of buried N+ bit lines 24.

The removal of TiN in opening 39 to form patterns 32' and 32" has three advantages. First it reduces the amount of energy required during ion implantation of $B^{11}$ ions 42. Secondly, it removes TiN from the surface of the dielectric layer 28' which prepares it for COB (chip on board) providing a surface to which the aluminum will bond. Thirdly, using the process in accordance with this invention the use of silicon dioxide removal ("silicon loss") during TiN overetching can make the code number thereby eliminating the need for stacked photoresist masks for code etching.

The FIGS. 1A–1F use the prior art process of forming stacked layers of photoresist for a Mask ROM. By using this invention, a stacked photoresist process is not needed to etch a code number on each die, since only the photoresist layer 35 is required to perform both process steps.

FIGS. 6A and 6B show a schematic diagram of a prior art technique used in accordance with this invention. The technique involves location of chip numbers C# on semiconductor chips Cn on a semiconductor wafer W. FIG. 6A shows a conventional semiconductor wafer W with a conventional alignment flat FL and a number of chips C1, C2, C3, and C4. FIG. 6B shows a typical single chip Cn which has been expanded in scale with a chip number C3 etched in the corner thereof. The code number C# is etched on the corner of each chip C1, C2, C3, C4 and Cn as shown in FIG. 6A. In addition, an conventional alignment scribe line SL is shown between chips C3 and C4.

Figure 2F:
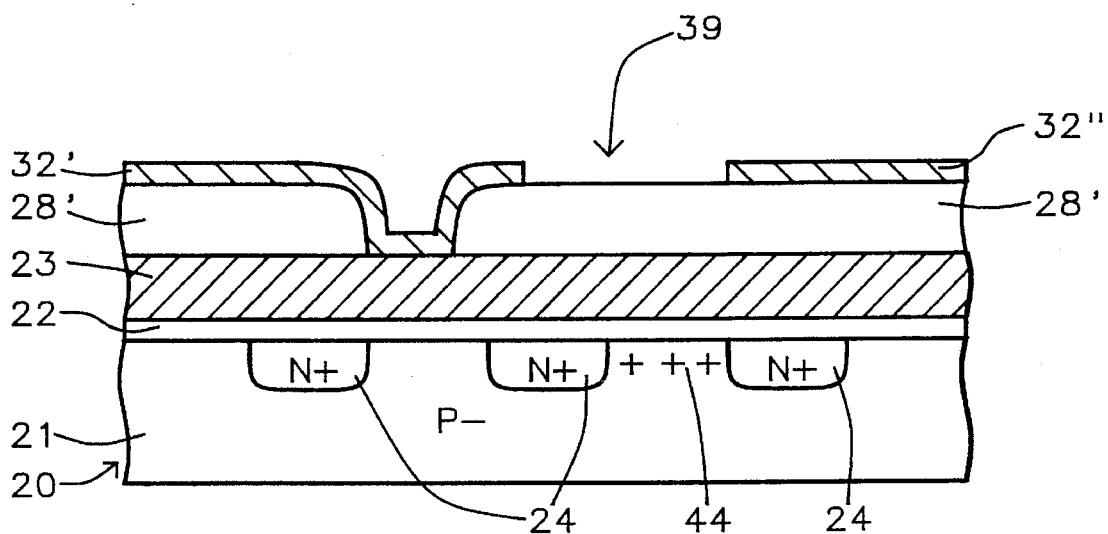

In FIG. 2F, the device of FIG. 2E is shown after the the mask 35 was stripped from the device 20. Next, the device is subjected to rapid thermal annealing (RTA) (otherwise known as rapid thermal processing (RTP)) within a range between about 650° C. and about 850° C., preferably at 750° C. to fully activate the code implant region and to reduce the high resistance of the buried N+ (BN+) bit lines 24 sheet resistance previously increased by the code implant damage. In other words, this RTA or RTA annealing process results in lower resistance of the damaged regions in the bit lines 24. As stated above, the advantage of full code activation is that it can provide a high code threshold voltage; and low implanted BN+ sheet resistance can reduce the current drop in the cell and reduce timing delay. The combination of both items achieves high circuit performance at both high and low voltages. The process involved is to first heat to 600° C. for 60 seconds and second heat to 750° C. for 20–30 seconds with a source of $NH_3+N_2$.

In summary in FIG. 2F, the device of FIG. 2E is shown after the ROM code (code number process has been completed during the simultaneous TiN removal) and the RTA process have been completed and after the stripping of the photoresist layer 35 in the conventional manner.

Figure 2G:
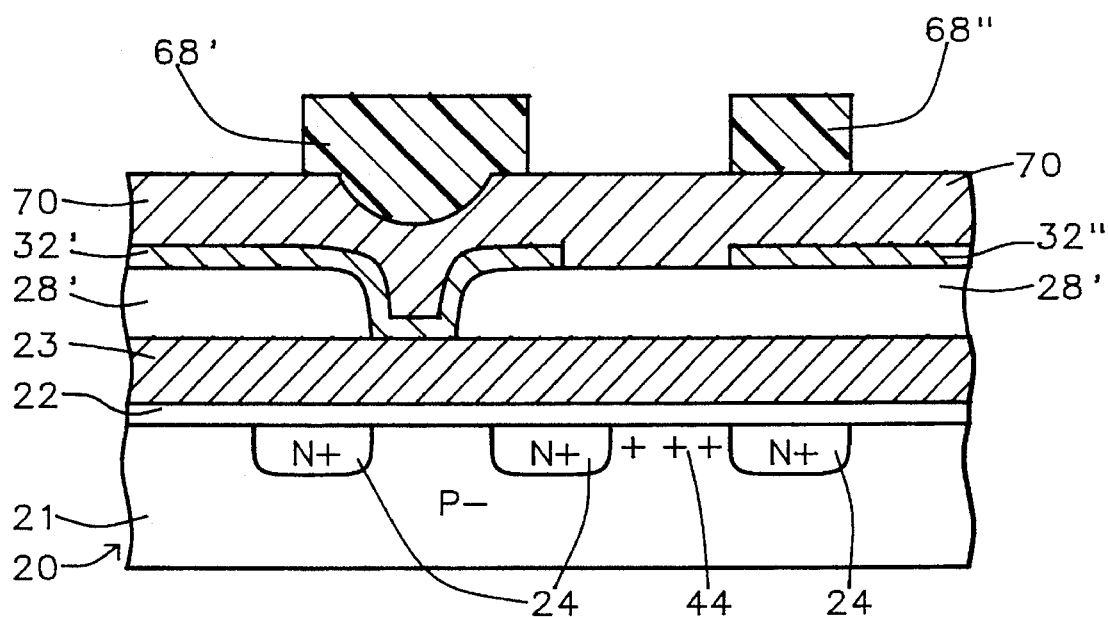

In FIG. 2G, the device of FIG. 2F is shown after it is coated with a blanket layer of metal 70 (aluminum) formed by sputtering at 400° C. for 12 seconds providing a thickness of 10KÅ of metal which extends into opening 30 in electrical and mechanical contact with the polysilicon layer 23 through the TiN layer 32'. Mask patterns 68' and 68" in FIG. 2G are used to protect the portions of metal layer 70 to be formed as metal structures 70' and 70" which are then formed by etching away the remainder of metal layer 70 by conventional metal etching techniques such as dry etching by an ECR plasma metal etching process.

Figure 2H:
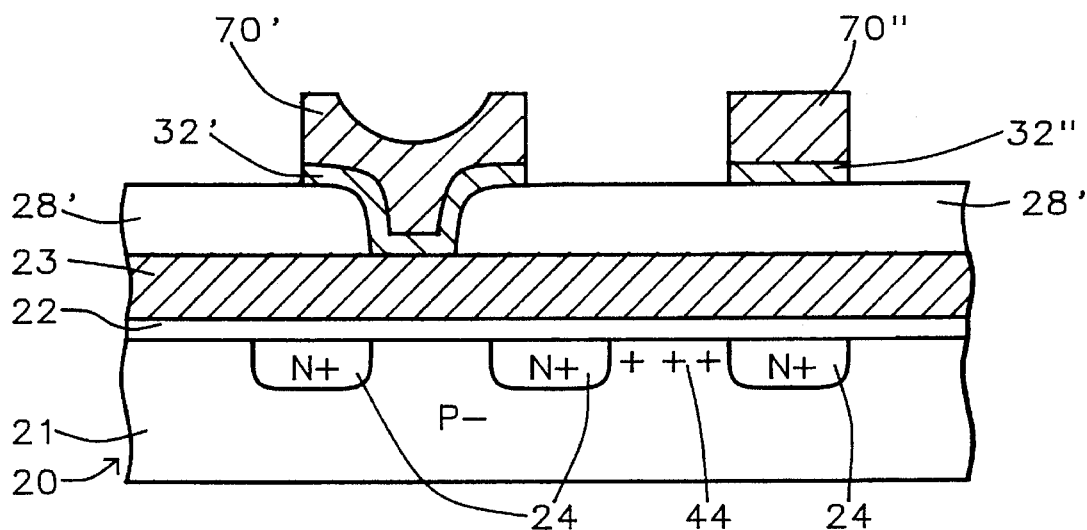

FIG. 2H shows the product of FIG. 2G after metal layer 70 has been patterned using a metal photolithographic masking comprising photoresist shaped into the mask patterns 68' and 68" seen in FIG. 2G, above layer 70, after the mask patterns 68' and 68" have been removed.

After this stage of the process, the device is passivated in accordance with the state of the art.

FIG. 3 shows a plan view of device 20 including buried bit lines 24 (in phantom) in the substrate, polysilicon word lines 23 (in phantom) orthogonally oriented with respect to bit lines 24 and overlying the bit lines 24. Metal lines 82 overlie alternate ones of the bit lines 24. A ROM code ion implant region is indicated by rectangle 50 and a buried bit line area damaged by code implantation is indicated by rectangle 52 which bridges across portions or all of three buried bit lines 24. FIG. 3 illustrates how buried N+ (BN+) can be damage by code implantation and how that can be compensated for by RTA (RTP.)

Figure 4A:
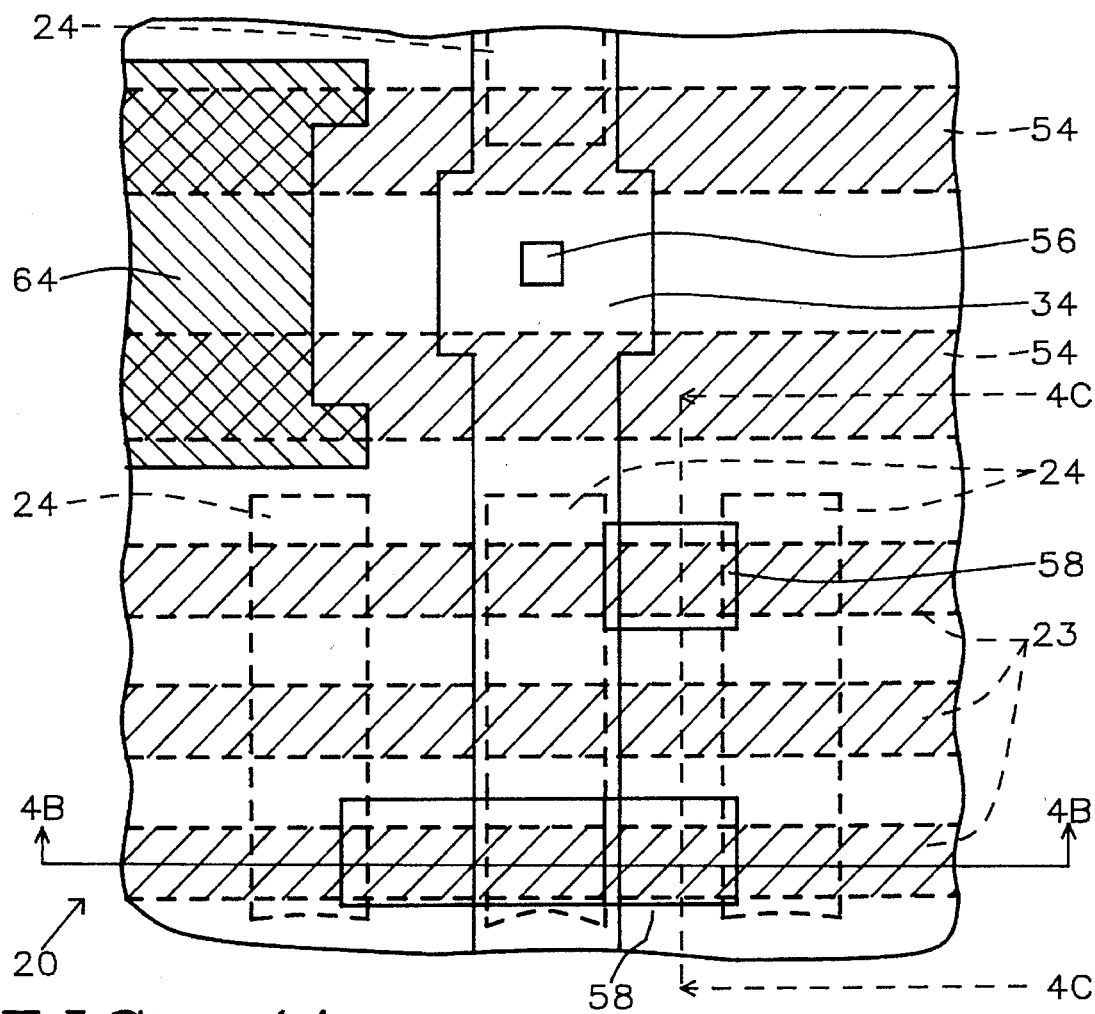
FIG. 4A is a plan view of a post-TiN ROM manufactured device in accordance with this invention.

FIG. 4A is a plan view of post-TiN ROM manufactured device in accordance with this invention. There are three buried N+ bit lines 24, (in phantom), in the substrate (with one bit line split into a pair of aligned bit lines,) polysilicon word lines 23 (in phantom) orthogonally oriented with respect to BN+ bit lines 24 and overlying those BN+ bit lines 24, as well as polysilicon lines 54 which are the selector word lines. Metal line 34 overlies the aligned pair of BN+ bit lines 24. Line 34 includes a contact region 56. A ROM region is indicated by area 58. Areas 64 are ROM code isolation areas.

Figure 4B:
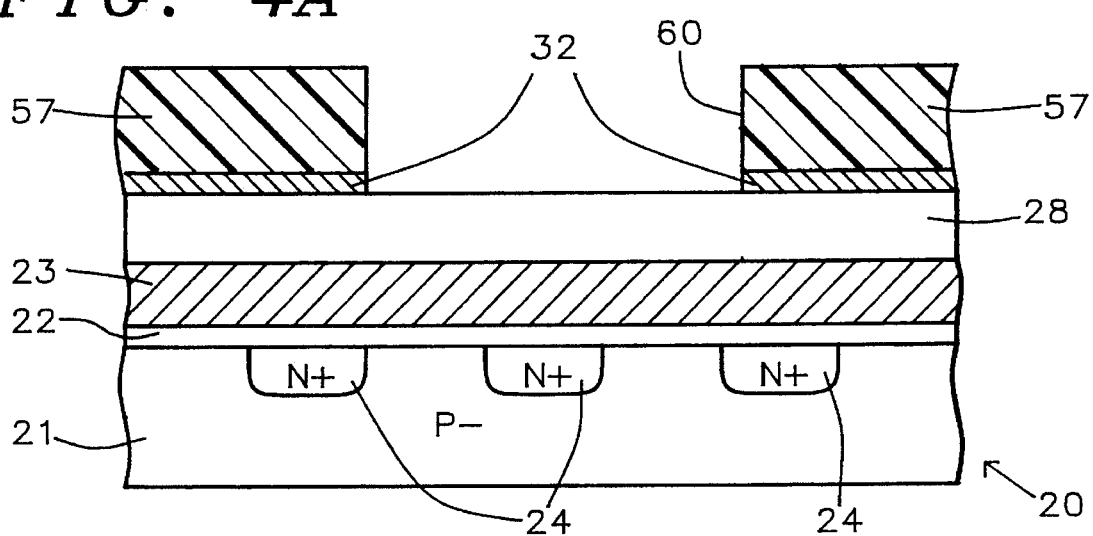
FIG. 4B is a sectional view taken along line 4B—4B in FIG. 4A.

FIG. 4B is a sectional view taken along line 4B—4B in FIG. 4A. The device comprises a substrate 21 with buried bit lines above which is formed the gate oxide layer 22 and a polysilicon word line 23 above the gate oxide layer 22. Above the polysilicon layer 23 is a blanket, BPSG glass, dielectric layer 28. Above the BPSG layer is a blanket TiN titanium nitride structure 32 over which is formed a photoresist mask 57 with opening 60 therethrough. The mask has been used for etching through opening 60 down through TiN layer 32 to expose a portion of the surface of the blanket dielectric layer 28' of BPSG glass.

FIG. 4C is a sectional view taken along line 4C—4C in FIG. 4A with similar reference numbers in FIG. 4B applying equally to FIG. 4C. In mask 57, openings 58 expose the space above two of the word lines 23, with just a thin layer of BPSG glass above them, but with the TiN layer etched away below openings 58.

FIG. 5A shows a post metal code implant process of the kind referred to by the middle column in Table 1 below.

TABLE 1

|  | CONVENTIONAL METHOD | POSTMETAL METHOD | CURRENT METHOD |
| --- | --- | --- | --- |
| CYCLE TIME | POOR | GOOD | GOOD |
| MINIMUM CODE SIZE | YES | NO | YES |
| CHIP ON BOARD ABILITY | NO | NO | YES |
| CELL LEAKAGE | LOW | HIGH | LOW |
| MAIN CHANGE FROM CONVENTIONAL METHOD | N.A. | BPSG THINNING 3,000Å | 1. BPSG THINNING 3,000Å 2. POLYSILICON THINNING |
| EXTRA PROCESS COMPARE WITH CONVENTIONAL METHOD | N.A. | SELECTOR ROW PHOTO & IMP. FOR (FOR LEAKAGE ISSUE) | 1. TiN ETCHING 2. SECOND RTA |
| LESS PROCESSING AS COMPARED TO CONVENTIONAL METHOD | N.A. | CODE PHOTOLITHOGRAPHY | CODE PHOTOLITHOGRAPHY & ETCHING |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM semiconductor device which comprises the steps in the sequential order of:

taking a semiconductor substrate with an array of parallel buried bit lines integral therewith, said layer buried bit lines being oriented in a first direction, a gate oxide lays:

above said substrate and said buried bit lines, and word lines formed above said gate oxide layer, forming a dielectric layer over laid word lines and said gate oxide layer, forming a contact hole in said dielectric layer, forming a blanket titanium nitride layer over said device extending into said contact hole, forming a ROM code cask over said device, said ROM code mask having a ROM code opening therethrough, said opening being centered between a pair of said bit lines, performing etching of said titanium nitride layer through said ROM code mask, said titanium nitride layer having a stop height over said dielectric layer, ion implanting a code implant dopant through said ROM code opening down into a doped region in said substrate below said ROM code opening, removing said ROM code mask, performing a rapid thermal annealing step, applying a blanket layer of metal to said device including said contact hole, and patterning said metal.

2. The method of claim 1 wherein said dielectric layer comprises a boron phosphorous glass material.

3. The method of claim 1 wherein said dielectric has a thickness of within the range between about 2,000Å and about 4,000Å.

4. The method of claim 1 wherein said dielectric has a thickness of about 3,000Å.

5. The method of claim 1 wherein the step height is within the range between about 400Å and about 700Å.

6. The method of claim 3 wherein, the step height is about 500Å.

7. The method of claim 1 wherein the step height is within the range between about 400Å and about 700Å.

8. The method of claim 7 wherein the step height is about 500Å.

9. The method of claim 3 wherein said rapid thermal annealing is performed within a range between about 650° C. and about 850° C.

10. The method of claim 9 wherein said rapid thermal annealing is performed at about 750° C.

11. The method of claim 3 wherein said rapid thermal annealing is performed within a range between about 650° C. and about 850° C.

12. The method of claim 11 wherein said rapid thermal annealing is performed at about 750° C.

13. The method of claim 12 wherein said dielectric layer comprises a material selected from BPSG and BPTEOS.

14. A method of manufacturing a role semiconductor device which comprises the steps in the sequential order of:

taking a semiconductor substrate with an array of parallel buried bit lines integral therewith, said buried bit lines being oriented in a first direction, a gate oxide layer above said substrate end said buried bit lines, and word lines formed above said gate oxide layer, forming a dielectric layer over said word lines, forming a contact hole in said dielectric layer, forming a blanket titanium nitride layer over said device extending into said contact hole, patterning said titanium nitride layer with a ROM code mask over said device, said ROM code mask having a ROM code opening therethrough, said ROM code opening being centered between a pair of said bit lines, performing a TiN etching through said code mask, ion implanting a code implant dopant through said ROM code opening down into a doped region in said substrate below said ROM code opening, removing said ROM code base, performing a rapid thermal annealing step after removing said ROM code mask, applying a blanket layer of metal to said device including said contact hole, and patterning said metal.

15. The method of claim 14 wherein said dielectric layer comprises a material selected from BPSG and BPTEOS.

16. The method of claim 14 wherein said dielectric has a thickness of within the range between about 2,000Å and about 4,000Å and preferably about 3,000Å.

17. The method of claim 16 wherein the step height is within the range between about 400Å and about 700Å and preferably about 500Å.

18. The method of claim 17 wherein said rapid thermal annealing is performed within a range between about 650° C. and about 850° C., and preferably at about 750° C.

19. The method of claim 18 wherein said dielectric layer comprises a material selected from BPSG and BPTEOS.

20. The method of claim 15 wherein the step height is within the range between about 400Å and about 700Å and preferably about 500Å, range between about 650° C. and about 850° C., and preferably at about 750° C., and said dielectric layer comprises a material selected from BPSG and BPTEOS.

* * * * *